(12) United States Patent
Hill et al.

(10) Patent No.: US 11,546,992 B2
(45) Date of Patent: Jan. 3, 2023

(54) MODULAR MOTHERBOARD FOR A COMPUTER SYSTEM AND METHOD THEREOF

(71) Applicant: Sanmina Corporation, San Jose, CA (US)

(72) Inventors: Charles C. Hill, Portland, OR (US); Franz Michael Schuette, Colorado Springs, CO (US)

(73) Assignee: SANMINA CORPORATION, San Jose, CA (US)

( * ) Notice: Subject to any disclaimer, the term of this patent is extended or adjusted under 35 U.S.C. 154(b) by 0 days.

(21) Appl. No.: 16/057,580

(22) Filed: Aug. 7, 2018

(65) Prior Publication Data

US 2019/0045634 A1 Feb. 7, 2019

Related U.S. Application Data

(60) Provisional application No. 62/542,161, filed on Aug. 7, 2017.

(51) Int. Cl.

| H05K 1/18 | (2006.01) |
| H05K 3/36 | (2006.01) |
| H05K 1/14 | (2006.01) |
| H05K 3/30 | (2006.01) |
| G06F 13/40 | (2006.01) |

(52) U.S. Cl.
CPC ............. *H05K 1/181* (2013.01); *G06F 13/40* (2013.01); *G06F 13/409* (2013.01); *H05K 1/141* (2013.01); *H05K 3/303* (2013.01); *H05K 3/36* (2013.01); *H05K 1/144* (2013.01); *H05K 2201/042* (2013.01); *H05K 2201/09218* (2013.01); *H05K 2201/10159* (2013.01); *H05K 2201/10189* (2013.01); *H05K 2201/10325* (2013.01)

(58) Field of Classification Search
CPC ......... H05K 1/181; H05K 1/141; H05K 1/144
See application file for complete search history.

(56) References Cited

U.S. PATENT DOCUMENTS

| 5,793,998 | A | * | 8/1998 | Copeland | ............... | H05K 1/144 |
| | | | | | | 361/748 |
| 6,178,526 | B1 | * | 1/2001 | Nguyen | ............... | G11C 29/028 |
| | | | | | | 714/42 |
| 6,362,974 | B1 | * | 3/2002 | Lettang | .................. | H05K 1/141 |
| | | | | | | 361/803 |
| 6,496,376 | B1 | * | 12/2002 | Plunkett | ............... | G06F 13/409 |
| | | | | | | 361/729 |
| 7,327,151 | B2 | * | 2/2008 | Kang | ..................... | G11C 29/56 |
| | | | | | | 324/756.02 |

(Continued)

*Primary Examiner* — James Wu
*Assistant Examiner* — Christopher L Augustin
(74) *Attorney, Agent, or Firm* — Loza & Loza, LLP; Heidi Eisenhut

(57) ABSTRACT

One feature pertains to a modular design of a motherboard for a computer system. The mother board is disaggregated into a CPU board and an IO board. The CPU board contains at least one CPU, the associated memory subsystem and the voltage regulator module. The integrated IO ports escape to a high speed connector mating with its counterpart on an IO board which contains all peripheral devices including system logic not part of the CPU. In a multi-socket configuration the CPUs are on the CPU board and the processor interconnects are routed directly in a point to point manner.

21 Claims, 10 Drawing Sheets

(56) References Cited

U.S. PATENT DOCUMENTS

| | | | | |
|---|---|---|---|---|
| 9,769,958 B2* | 9/2017 | Jaskela | ............... | H05K 7/20718 |
| 2004/0218361 A1* | 11/2004 | Lin | ................. | H05K 1/144 |
| | | | | 361/695 |
| 2006/0109625 A1* | 5/2006 | Harris | ................. | G06F 1/184 |
| | | | | 361/695 |
| 2006/0126297 A1* | 6/2006 | Belady | ................. | G06F 1/189 |
| | | | | 361/700 |
| 2006/0133041 A1* | 6/2006 | Belady | ................. | G06F 1/20 |
| | | | | 361/704 |
| 2006/0181857 A1* | 8/2006 | Belady | ................. | H01L 23/467 |
| | | | | 361/719 |
| 2008/0126863 A1* | 5/2008 | Co | ................. | G11C 29/56 |
| | | | | 714/29 |
| 2009/0251867 A1* | 10/2009 | Sharma | ................. | H04Q 1/08 |
| | | | | 361/737 |
| 2010/0254096 A1* | 10/2010 | Kim | ................. | G06F 1/185 |
| | | | | 361/737 |
| 2012/0262863 A1* | 10/2012 | Johnson | ................. | H05K 1/0243 |
| | | | | 361/679.02 |
| 2012/0295453 A1* | 11/2012 | Cipolla | ................. | H01R 12/716 |
| | | | | 439/67 |
| 2014/0126142 A1* | 5/2014 | Dean | ................. | G06F 1/20 |
| | | | | 361/679.47 |
| 2014/0133084 A1* | 5/2014 | Lin | ................. | G06F 1/185 |
| | | | | 361/679.32 |
| 2014/0217571 A1* | 8/2014 | Ganesan | ................. | H01R 12/62 |
| | | | | 257/693 |
| 2015/0022990 A1* | 1/2015 | French, Jr | ................. | H05K 3/368 |
| | | | | 361/792 |
| 2018/0007788 A1* | 1/2018 | Phares | ................. | H05K 5/0069 |

\* cited by examiner

MODULAR MOTHERBOARD FOR A COMPUTER SYSTEM AND METHOD THEREOF

CLAIM OF PRIORITY UNDER 35 U.S.C. § 119

The present application for patent claims priority to U.S. Provisional Application No. 62/542,161 entitled "Modular Motherboard for a Computer System and Method Therefor", filed Aug. 7, 2017, and assigned to the assignee hereof and hereby expressly incorporated by reference herein.

FIELD

The present disclosure generally relates to server computers and other processing apparatuses. More particularly, modular motherboards with interchangeable input/output (IO) configurations are disclosed.

BACKGROUND

The backbone of a computer system is the mainboard or motherboard that typically contains the central processing unit (CPU), a system logic or chipset and various on-board devices, e.g. Ethernet controller, or expansion connectors such as peripheral computer interconnect express (PCIe) slots. Most motherboards are monolithic designs, that is, a single printed circuit board (PCB) accommodates the CPUs and all peripherals regardless of whether they are chipdown, i.e. soldered on to the PCB or removable cards.

In server computers, multiple CPUs sharing a single system logic and being interconnected through a dedicated bus are a common design. This design using symmetric multiprocessing (SMP) effectively doubles the computational power and input/output (IO) resources. However, routing out all available input/output (IO) ports becomes increasingly difficult and poses some significant challenges specifically with respect to signal integrity (SI). Of particular relevance are the electromagnetic interferences between different signal traces and the loss of signal with increasing trace length.

Furthermore, the transition to higher data rate signaling increases the problems with signal integrity. Some of these issues can be addressed by using better board substrates with a lower loss tangent and more sophisticated trace routing including, but not limited to, signal skew matching and shielding. However, in view of the above, it is clear that new design strategies are needed to reduce the overall trace length in order to improve signal integrity while saving board manufacturing cost.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature a computer motherboard is provided. The computer motherboard comprises a first printed circuit board assembly and a second printed board assembly. The first printed circuit board assembly comprises a first printed circuit board having a first surface and an opposite second surface; a first central processing unit mounted on the first surface of the first printed circuit board, the first central processing unit having integrated input/output ports; a system memory socket mounted on the first surface of the first printed circuit board; a power supply for powering the central processing unit and the memory slot; and a first high speed data connector mounted on the second surface of the first printed circuit board and connected to the integrated input/output ports of the first central processing unit. The second printed circuit board assembly comprises a second printed circuit board having a first surface and an opposite second surface; an input/output interface coupled to the first surface of the second printed circuit board; and a second high speed data connector mounted on the second surface of the second printed circuit board and adapted to couple with the first high speed data connector of the first printed circuit board assembly and a high speed peripheral device interface.

According to one aspect, the second printed circuit board assembly further includes at least one of a system logic integrated circuit, a management controller and a high speed peripheral device interface mounted thereon.

According to another aspect, the motherboard further comprises a boot device removably coupled to the second printed circuit board assembly.

According to yet another aspect, the first printed circuit board assembly further comprises a second central processing unit mounted on the first surface of the first printed circuit board; an interconnect bus, between the first central processing unit and the second central processing unit, routed point to point on the first printed circuit board; and wherein signals from the integrated input/output ports from the first and second central processing units share the first high speed data connector.

According to yet another aspect, the motherboard further comprises a third high speed connector mounted on the first printed circuit board assembly and configured to couple with a fourth high speed connector mounted on the second printed circuit board assembly.

According to yet another aspect, the first high speed data connector is positioned adjacent to the first central processing unit and away from the second processing unit; and wherein the third high speed connector is positioned adjacent to the second central processing unit and away from the first central processing unit.

According to yet another aspect, the first high speed data connector is coupled to only the first central processing unit, and the third high speed connector is coupled to only the second central processing unit.

According to yet another aspect, the first high speed data connector is positioned between the first and second central processing units.

According to yet another aspect, the first high speed data connector carries signals between the first and second central processing units and the second printed circuit board assembly.

According to another feature, a method for manufacturing a computer motherboard with reduced length interconnection traces is provided. The method comprises dividing the motherboard into a first printed circuit board assembly and a second printed circuit board assembly; forming a first printed circuit board assembly and forming a second printed circuit board. The first printed circuit board assembly comprises a first printed circuit board having a first surface and an opposite second surface; a first central processing unit mounted on the first surface of the first printed circuit board, the first central processing unit having integrated input/output ports; a system memory socket mounted on the first surface of the first printed circuit board; a power supply to provide power to the central processing unit and the memory slot; and a first high speed data connector mounted on the second surface of the first printed circuit board and connected to the integrated input/output ports of the first central processing unit. The second printed circuit board comprises a second printed circuit board with a first surface and an opposite second surface; an input/output interface coupled to the first surface of the second printed circuit board; a high-speed peripheral device interface; and a second high speed data connector mounted on the second surface of the second printed circuit board, and adapted to couple with the first high speed data connector of the first printed circuit board assembly and a high speed peripheral device interface.

According to one aspect, the second printed circuit board assembly includes at least one of a system logic integrated circuit and a management controller integrated thereon.

According to another aspect, a boot device is removably attached to the second printed circuit board assembly.

According to yet another aspect, the first printed circuit board assembly further comprises a second central processing unit mounted on the first surface of the first printed circuit board; an interconnect bus, between the first central processing unit and the second central processing unit, routed point to point on the first printed circuit board; and wherein signals from the integrated input/output ports from the first and second central processing units share the same first high speed data connector.

According to yet another aspect, the first printed circuit board assembly further comprises a second central processing unit integrated on the first printed circuit board assembly; and, wherein an interconnect bus, between the first and the second central processing unit, routed point to point on the printed circuit board; wherein signals from the integrated input/output ports of the first central processing unit are routed to the first connector; and wherein signals from the integrated input/output ports of the second central processing unit are routed to a third connector configured to mate with a fourth connector on the second printed circuit board assembly.

According to yet another feature, a computer motherboard is provided. The motherboard comprises a first printed circuit board assembly and a second printed circuit board assembly. The first printed circuit board assembly comprises a first printed circuit board having a first surface and an opposite second surface; one or more central processing units mounted on the first surface of the first printed circuit board; a system memory socket mounted on the first surface of the first printed circuit board; and a first high speed data connector mounted on the second surface of the first printed circuit board and connected to the one or more central processing units. The second printed circuit board assembly comprises a second printed circuit board having a first surface and an opposite second surface; an input/output interface coupled to the first surface of the second printed circuit board; a high-speed peripheral device interface; and a second high speed data connector mounted on the second surface of the second printed circuit board and adapted to couple with the first high speed data connector and the high speed peripheral device interface.

According to one aspect, routing of a signal path from the one or more central processing units to the input/output interface and/or the high-speed peripheral device interface is reduced.

According to yet another feature, a computer motherboard assembly is provided. The computer motherboard assembly comprises a first printed circuit board assembly, a second printed circuit board assembly and a third printed circuit board assembly. The first printed circuit board assembly comprises a first printed circuit board having a first surface and an opposite second surface; one or more central processing units mounted on the first surface of the first printed circuit board; a system memory socket mounted on the first surface of the first printed circuit board; and a first high speed data connector mounted on the second surface of the first printed circuit board and connected to the one or more central processing units. The second printed circuit board assembly comprises a second printed circuit board having a first surface and an opposite second surface; one or more central processing units mounted on the first surface of the second printed circuit board; a system memory socket mounted on the first surface of the second printed circuit board; and a second high speed data connector mounted on the second surface of the second printed circuit board and connected to the one or more central processing units. The third printed circuit board assembly comprises a third printed circuit board having a first surface and an opposite second surface; an input/output interface coupled to the first surface of the second printed circuit board; a high speed peripheral device interface; a third high speed data connector mounted on the second surface of the second printed circuit board, the third high speed data connector adapted to couple with the first high speed data connector and the high speed peripheral device interface; and a fourth high speed data connector mounted on the second surface of the second printed circuit board, the fourth high speed data connector adapted to couple with the second high speed data connector and the high speed peripheral device interface.

According to one aspect, the high speed peripheral device interface comprises at least two connectors.

According to another aspect, the third printed circuit board assembly is adapted to connect to a first boot device for the first circuit board assembly and a second boot device for the second circuit board assembly.

According to yet another aspect, the third printed circuit board assembly is adapted to couple the one or more central processing units of the first circuit board assembly and the second circuit board assembly.

According to yet another aspect, wherein the third printed circuit board is configured to route a first group of high speed signals from the first printed circuit board and the second printed circuit board to a left high speed peripheral device interface and a second group of high speed signals from the first printed circuit board and the second printed circuit board to a right high speed peripheral device interface.

DETAILED DESCRIPTION

Figure 1:
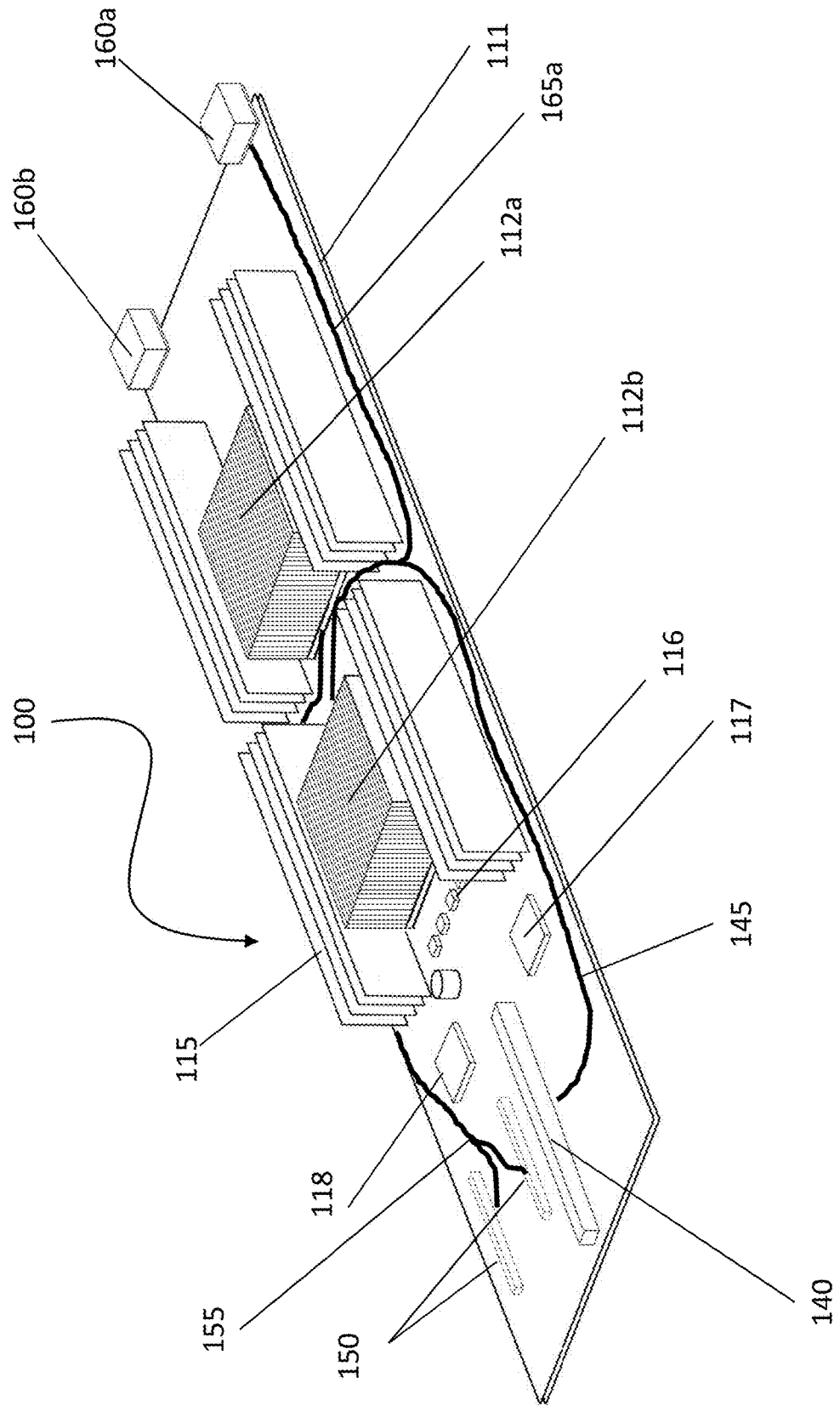
FIG. 1 illustrates a conventional motherboard design.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details.

The word "exemplary" or "embodiment" is used herein to mean "serving as an example, instance, or illustration." Any implementation or aspect described herein as "exemplary" or as an "embodiment" is not necessarily to be construed as preferred or advantageous over other aspects of the disclosure. Likewise, the term "aspects" does not require that all aspects of the disclosure include the discussed feature, advantage, or mode of operation.

In the following description, certain terminology is used to describe certain features of one or more embodiments. The term "board" as used in motherboard or IO board may refer to a board assembly including all mechanical and electronic components unless specifically called out as printed circuit board (PCB), which refers to the raw board only. The term "PCIe" may refer to any generation of PCIe including Gen-Z and any subsequent iterations and its respective line speed and encompasses the protocol, the transmission lines as well as transmit and receive logic. The term memory subsystem may refer to a functional description of one or more dual inline memory modules (DIMMs) associated with a CPU node. The term "top" surface of a printed circuit board is irrespective of the actual orientation of the board in any system configuration and is merely meant to designate the surface that contains the majority of components, whereas the term "bottom" surface is meant to describe the side of the printed circuit board with fewer or smaller components.

Overview

The present disclosure is directed to solving the problems of the design complexity of the input/output portion of modern motherboards. More specifically, the problem of signal integrity degradation along high speed signaling paths, such as PCIe, is addressed. Although a PCIe interconnect is described, this is by way of example only and any other protocol or high speed signal interface may be substituted for PCIe.

According to one aspect, a motherboard may be split into two (or more) separate boards with the first board (card) containing a CPU, a chipset, and IO interfaces and the second board (card) containing integrated controllers for additional IO functionality. The first board and the second board may be aligned back to back in substantially parallel planes and are connected through a bridge card.

According to another aspect, a motherboard may be designed to have at least two CPUs, a chipset, an integrated network controller and several IO ports but divided into two (or more) separate printed circuit board assemblies (PCBAs). The two PCBAs may be arranged in a substantially parallel orientation. Signal connection between the two PCBAs may be provided with one or more connectors on the back of each PCBA so that the main components are facing away from each other.

Example

In one example, a primary CPU board only contains the two CPUs and the memory subsystem along with their respective power supplies whereas a secondary board includes the chipset (e.g., IO chips/integrated circuits that perform such functions as data flow management between the processor, memory, and peripherals), the expansion connectors and any chip-down peripherals. The CPUs may be socketed or soldered directly to the primary PCBA with the power supply pins facing substantially outwards and the IO pins oriented towards the center.

Unless the chipset or system logic (e.g., a platform controller) is integrated on the CPUs, it may be integrated on the secondary board. The secondary board may further have a management controller as well as all expansion connectors and chip-down peripheral controllers.

A CPU-to-CPU interconnect bus may be routed directly on the primary CPU board whereas all high speed IO buses may be routed to the connector bridging the two boards. Power input may be received by the secondary board and routed through standoffs to the primary CPU board. Alternatively, dedicated high current power connectors (for example standoffs connecting to the power and ground planes) between the two boards may be considered or else, the two boards may be powered independently from a system power supply.

In the case that secondary IO controllers or switches/expanders are integrated as a chip-down solution on the secondary board, the secondary board may connect with a base-board, a mid plane or a drive plane that provide the interconnect to storage devices such as hard disk drives or solid state drives.

According to one feature, a motherboard to be used with a computer system may comprise a first printed circuit board assembly and a second printed circuit board assembly. The first printed circuit board assembly may include a first printed circuit board with a top surface (e.g., first surface) and a bottom surface (e.g., second surface). A first central processing unit, a system memory socket, and power supplies may be further included to provide power to the central processing unit and the memory slot may be mounted on the top surface. A high speed data connector may be mounted on the bottom surface and connected to integrated IO ports of the central processing unit. The second printed circuit board assembly may include a second printed circuit board with a top surface and a bottom surface wherein a management controller, an IO interface and an interface for a high-speed peripheral device may be integrated at its top surface. The bottom surface may have mounted thereon a second high speed data connector adapted or configured to mate with the first high speed data connector of the first printed circuit board assembly and the connector may be connected to the interface for the high speed peripheral device.

In a specific aspect, a system logic IC or chipset may be integrated on the second printed circuit board assembly. In another specific aspect, the chipset may be integrated on the central processing unit and therefore on the first circuit board assembly. Additionally, a boot device may be removably attached to the second printed circuit board assembly.

In a specific aspect, the motherboard may comprise a dual socket configuration and a second central processing unit may be integrated on the first printed circuit board assembly. The first and the second central processing units may be connected via an interconnect bus which is routed point to point on the printed circuit board. The high speed signals from the integrated IO ports of both central processing units may share the same first connector.

In another specific aspect, a third high speed connector may be integrated on the bottom of the first printed circuit board assembly and configured to mate with a fourth connector on the bottom of the second printed circuit board assembly.

Another aspect of the disclosure provides a method for reducing the length of interconnecting traces on a motherboard used in a computer system. The method comprises disaggregating or splitting the motherboard into a first printed circuit board assembly and a second printed circuit board assembly, wherein the first printed circuit board assembly has a first printed circuit board with a top surface (e.g., first surface) and a bottom surface (e.g., second surface). A first central processing unit, a system memory socket, and power supplies to provide power to the central processing unit and the memory slot may be integrated on the top surface. A first high speed data connector connected to integrated IO ports of the central processing unit may be integrated on the bottom surface.

The second printed circuit board assembly may have a second printed circuit board with a top surface and a bottom surface with a management controller, an IO interface and an interface for a high speed peripheral device mounted on the top surface of the second printed circuit board. A second high speed data connector adapted or configured to mate with the first high speed data connector of the first printed circuit board assembly may be mounted on the bottom surface and connected to the interface for the high speed peripheral device.

A system logic IC or chipset may be integrated on the second printed circuit board assembly. Additionally, a boot device may be removably attached to the second printed circuit board assembly.

In another aspect of the present disclosure, a second central processing unit may be integrated on the first printed circuit board assembly. An interconnect bus between the first and the second central processing unit may be routed point to point on the printed circuit board. The signals from the integrated IO ports of both central processing units are sharing the same first connector.

In yet another aspect of the present disclosure, a second central processing unit may be integrated on the first printed circuit board assembly. The processors may be rotated to share a common voltage regulator module and the integrated IO pins of the two processors are pointing away from each other. The interconnect bus between the first and the second central processing units may be routed point to point on the printed circuit board. The signals from the integrated IO ports of the first central processing unit may be routed to the first connector of the first printed circuit board assembly configured to mate with a second connector on the second printed circuit board assembly, whereas signals from the integrated IO ports of the second central processing unit may be routed to a third connector configured to mate with a fourth connector on the second printed circuit board assembly.

Another variation of the design may split the motherboard into two CPU complexes with a single CPU socket, its respective memory slots and the voltage regulator module (VRM). Each CPU board routes out its PCIe bus to the IO card. The IO card may further serve as a bridge board for the QPI bus connecting the two CPUs.

In a different aspect of the disclosure, a first motherboard having a CPU socket with its respective memory slots and the VRM on a first surface and high speed connectors on a second surface coupled through high speed signal traces to the IO pins of the CPU socket may be configured to mate with an IO board having high speed connectors to mate with the CPU board on a first surface and additional high speed connectors on a second surface. The first motherboard and the IO board may be oriented in substantially parallel planes. The IO board may be further configured to mate with a second CPU board and to route some high speed IO traces to provide coupling between a CPU on the first motherboard and a CPU on the second motherboard.

In a variation of the design, the IO board may be configured to route IO traces from the first motherboard and the second motherboard to matching connectors on a plurality of secondary system interface boards.

In another variation of the design, a baseboard management controller, a power sequence controller IC and a BIOS ROM for each motherboard may be integrated on the IO board.

Peripheral Computer Interconnect Express

Peripheral Computer Interconnect Express (PCIe) is the interconnect bus of choice in modern computer architecture. PCIe ended the single ended transmission line scheme used in the original PCI bus and introduced differential pair signaling to achieve a transmission rate of 2.5 Gigabits per second (Gb/s) in the first generation. The next generations of PCIe increased the transmission rates to 5 Gb/s and 8 Gb/s for Gen 2 and Gen 3, respectively.

The high speed transmission rate of PCIe requires extremely precise routing of the differential pairs to maintain close coupling of the positive and negative signal propagation delays through length matching, distributing the effects of fiberglass bundle weaves and resin-rich areas of the dielectric by angling the routing relative to the weave patterns of the board substrate. Regardless of all these precautions and routing rules, there is a limitation in the maximum trace length until signal loss makes the signal unrecoverable. Better dielectric materials with lower loss tangent have been developed to mitigate the loss but there are limitations even at PCIe Gen3.

The next generation (Gen4) will run at twice the line speed of Gen3, that is 16 Gb/s which will constrain the routing of signal traces even further. In order to achieve better signal integrity, it is mandatory to maintain the shortest possible trace length.

Typical Motherboard as Used in a Server Computer

FIG. 1 shows a conventional motherboard 100 as used in a server computer. The motherboard 100 has a printed circuit board 111, with a platform controller 117 and a management controller 118, as well as two CPUs (CPU1, CPU0) 112*a*, 112*b* with eight memory slots each, populated with dual in-line memory modules (DIMMs) 115. PCIe traces 145 to a PCIe expansion slot 140 at the front end of the motherboard 100 are routed from CPU1 112*b* and PCIe traces 155 are routed from CPU0 112*a* to an open compute platform (OCP) mezzanine interface 150 for PCIe devices.

Other PCIe traces 165*a* are routed to the back of the motherboard 100 where they terminate in a first connector 160*a* or a second connector 160*b* adapted to receive daughter boards that contain additional system logic. A typical board in this particular form factor is usually approximately 22-25 inches long and since the PCIe trace bundles need to be routed to steer clear of keep-out zones containing other high speed buses or highly inductive power components of the voltage regulator module 116, a typical trace length will be around 20 inches for any differential pair. In the case of PCIe Gen3 running at 8 Gb/s line speed, this amount of trace length is still affordable but with the transition to PCIe Gen4, increasing the transmission rate to 16 Gb/s with this type of board configuration will suffer from severe problems related to signal loss and signal integrity.

Modular Motherboard Assembly

Figure 2:
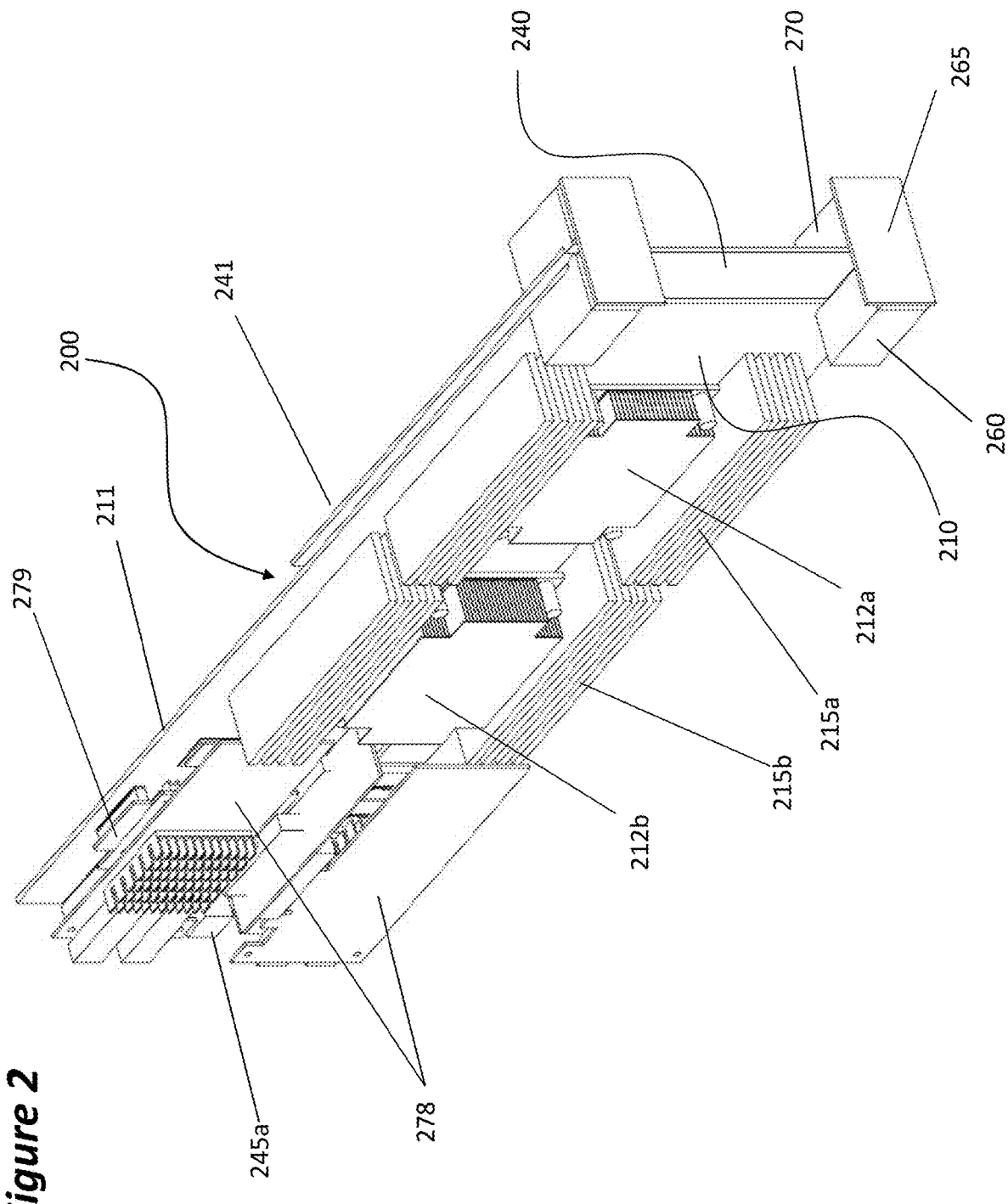
FIG. 2 illustrates a front side perspective view of a first exemplary modular motherboard according to one embodiment.

FIG. 2 illustrates a front side perspective view of a first exemplary modular motherboard assembly 200 designed to work in a folded configuration. As shown, the modular motherboard assembly 200 has a CPU board 210 comprising two CPUs 212a, 212b, respective memory modules 215a, 215b, and a limited number of IO functionality such as, for example, a universal serial bus (USB) port 245a and PCIe interface slots for PCIe 278 and OCP IO cards 279. Additional IO lanes may be routed to a high speed connector 260 which interfaces with a bridge board 265, which, in turn, interfaces with the high speed connector 270 on the IO board 240, the second PCB 241 of which is aligned in substantially parallel fashion to the first PCB 211 of the CPU board in a back to back configuration with a substantial overlap of the CPU board 210 and the IO board 240.

Figure 3:
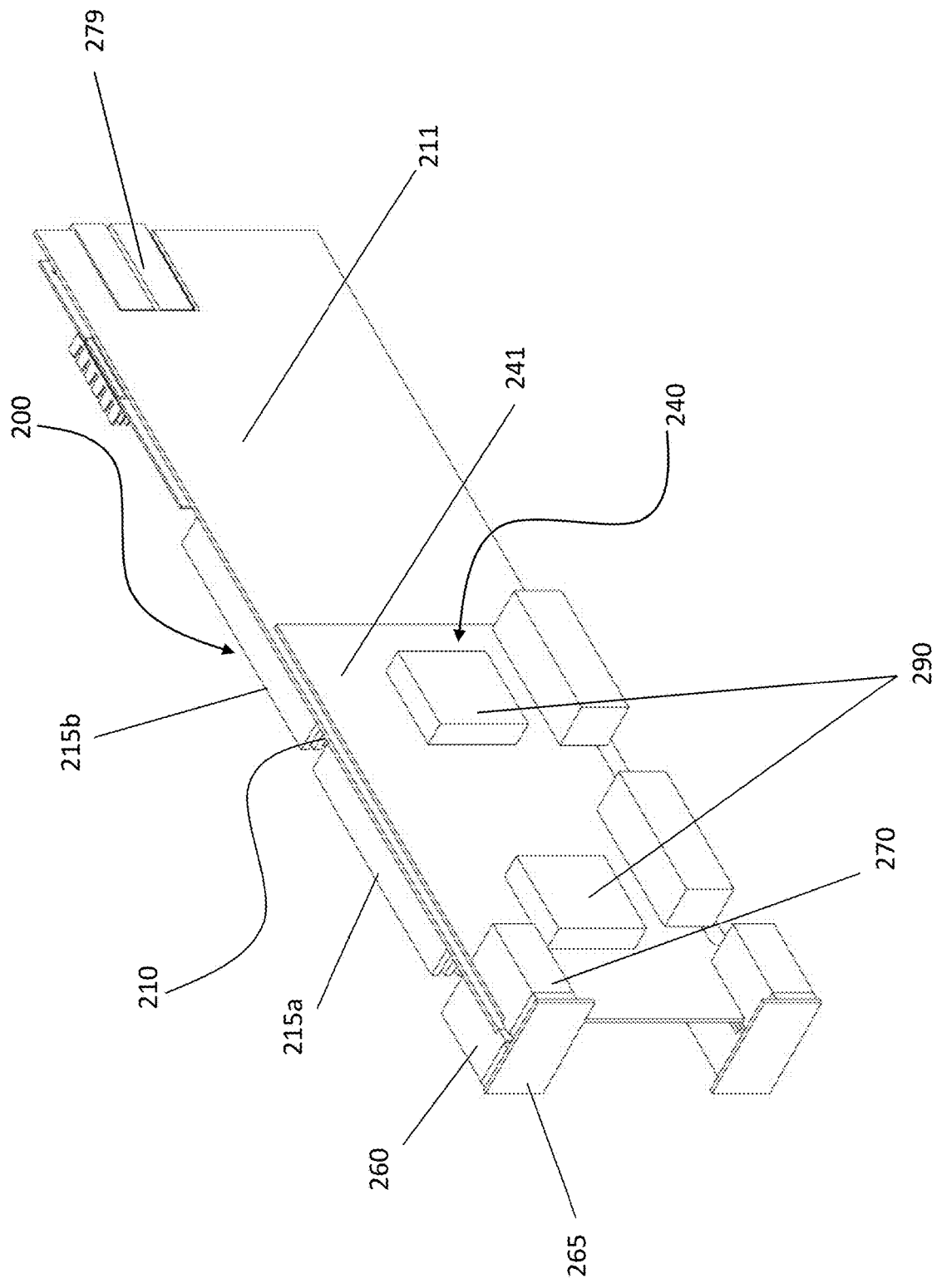
FIG. 3 illustrates a back side perspective view of the first modular motherboard of FIG. 2.

FIG. 3 illustrates a back side perspective view of the modular motherboard assembly 200 of FIG. 2. As discussed previously, the CPU board 210 includes memory modules 215a, 215b and the OCP card 279 which, as can be seen in FIG. 3, may be behind the IO board 240, the PCB 241 of which is partially overlapping with the CPU board PCB 211 in a back to back configuration. The IO board 240 has additional controllers 290, which receive their signals from the CPUs located on CPU board 210 through high speed connectors 260 and 270 that are interconnected via the bridge board 265.

Figure 4:
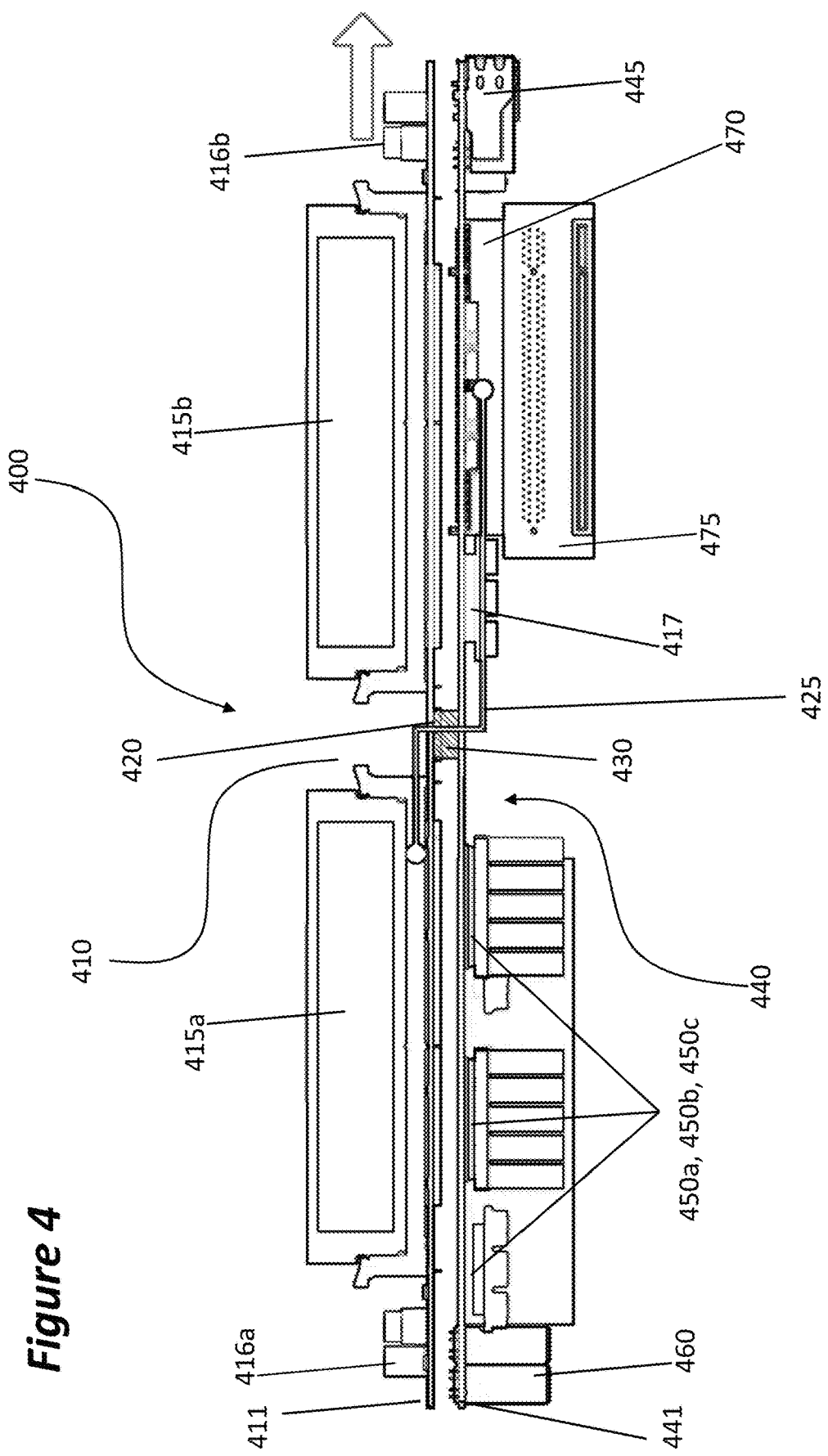
FIG. 4 illustrates an isometric view a second exemplary modular motherboard assembly according to one embodiment.

FIG. 4 illustrates a side view of a second exemplary modular motherboard assembly 400 according to one embodiment. The modular motherboard assembly 400 may have similar functionality as those shown in FIGS. 1-3 and is constructed in a way to minimize trace length. The modular motherboard assembly 400 may be an assembly of two separate boards. The first board, hereafter referred to as CPU board 410, has a printed circuit board (PCB) 411 to integrate at least one CPU, its memory subsystem 415a and the CPU and memory power supply or voltage regulator modules (VRM) 416a. In most cases, the CPU board will have two CPUs 412a, 412b (See FIG. 5) with their memory subsystems 415a, 415b having a DIMM installed in a memory slot, and separate VRMs 416a, 416b. The VRMs 416a, 416b are generating the supply voltage for the CPUs and DIMMs.

In many modern CPUs, the power pins are on one side of the pin or land array, whereas the system IO pins or lands are on the other side. For example and ease of understanding, the power pins may be on the east side of the array and the system IO pins may be on the west side of the array. Depending on the specific CPU in question, it may have several memory channels and the memory IO pins DQ would be on the north and south of the array. The system IO pins are primarily the high speed differential PCIe pin pairs and the CPU-interconnect bus, for example QuickPath Interconnect (QPI), UltraPath Interconnect (UPI), HyperTransport bus, or any other bus known in the art.

For ease of routing, in a dual CPU or dual socket board, the CPUs may be rotated 180 degrees relative to each other so that the system IO pins of both CPUs are facing each other. This allows for the shortest and least convoluted routing of the CPU interconnect bus.

The PCIe lanes may be routed to a mezzanine connector 420 mounted on the back or bottom side of the PCB. The connector 420 may be a high-speed, high density pin array with enough pins and shields to route all PCIe lanes including those used as interconnect to the chipset, e.g. desktop management interface (DMI) to the platform controller hub (PCH).

The mating counterpart 430 to connector 420 may be mounted on a second PCB 441, which contains all interfaces to the outside world, the assembly of which is hereafter referred to as the IO board 440 (the second board). The IO board 440 may contain the system logic or chip set (if required), as for example a South bridge or platform controller hub (PCH). The IO board 440 may further contain a baseboard management controller (BMC) or equivalent management or Super IO controller.

In addition, the IO board 440 may contain all chip-down peripheral devices 450a, 450b, 450c that may be connected to the PCIe integrated IO (IIO) root complex via differential pair PCIe lanes or any other suitable interconnect/protocol. Such chip-down devices may include, but are not limited to, SAS/SATA/RAID controllers including SAS/SATA/NVMe tri-mode devices, expanders, PCIe switches, Ethernet or Fibre Channel controllers, audio and video controllers and any other peripheral interface controllers known in the art, including but not limited to, USB and FireWire, as well as their respective connectors 445. The IO board 440 may further contain a PCIe expansion slot 470 in either the standard form factor or configured to conform with the OCP specification or any variation thereof.

The PCIe expansion slot 470 may be wired through a mezzanine connector to one of the two CPUs through data path 425. The PCIe expansion slot 470 may be used in combination with a PCIe riser card 475. In addition, the IO board 440 may contain any proprietary connector 460 to connect to a backplane, midplane, baseboard or any other structure known in the art to connect to peripheral devices. Non-limiting examples for such peripheral devices are hard disk drives (HDDs), graphics processing units (GPUs), and co-processors.

Figure 5:
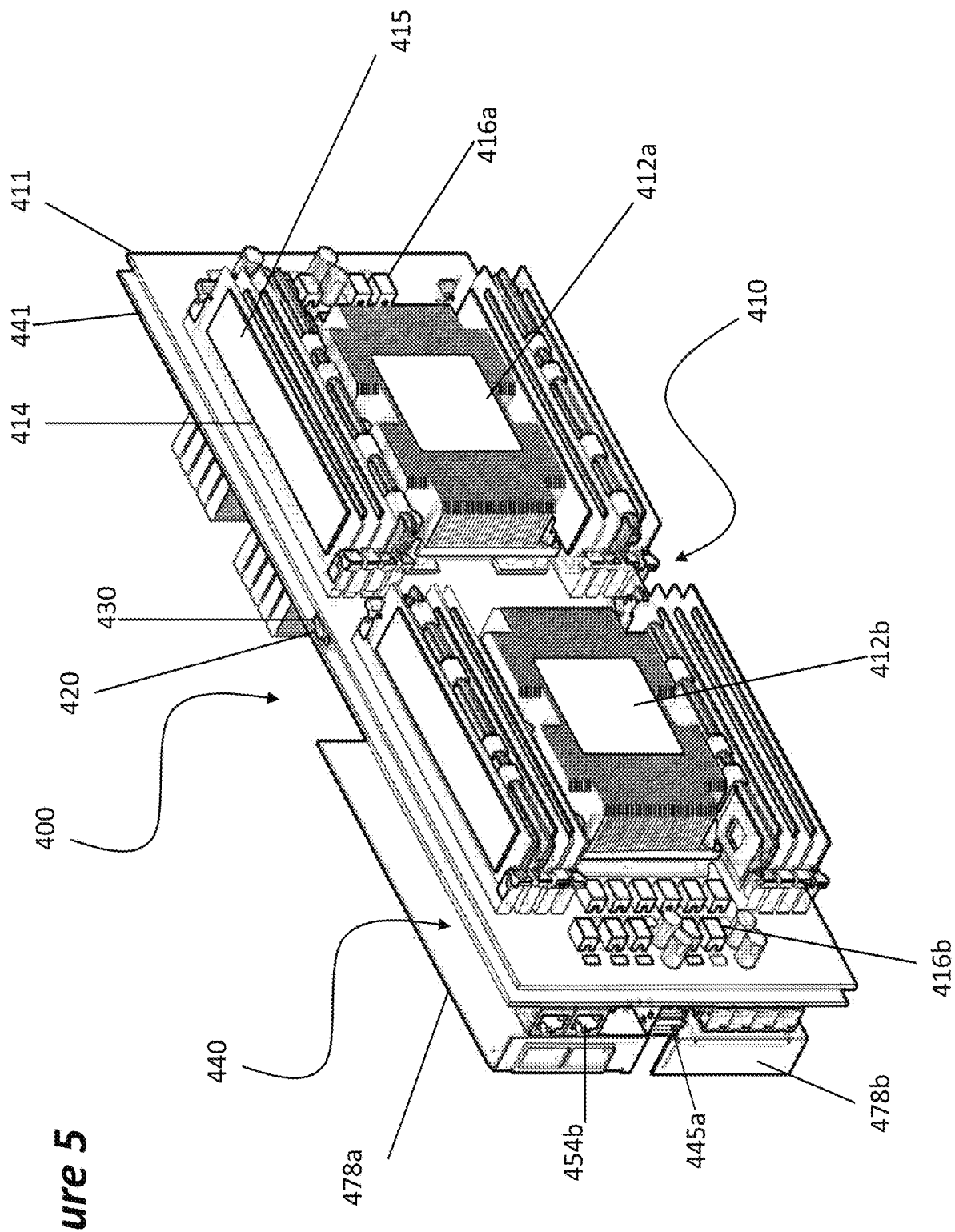
FIG. 5 illustrates a side perspective view of the modular motherboard assembly of FIG. 4.

FIG. 5 illustrates a side perspective view of the modular motherboard assembly 400 of FIG. 4. As discussed above, the CPU board 410 includes the printed circuit board 411 having the two CPUs 412a, 412b and the two VRMs 416a, 416b arranged on the outside of the two CPUs 412a, 412b. Each CPU has a plurality of DIMM slots 414 populated with memory modules 415.

Centrally located on the backside of CPU board 410 is the mezzanine connector 420 that mates with its counterpart connector 430 mounted on the backside of the second board PCB 441. The IO board (or IO board assembly) 440 may include several chip down logic components such as USB terminating in USB ports 445a and integrated Ethernet accessible through RJ45 network connectors 445b. Additional IO functionality may be provided through PCIe add in cards 478a, 478b.

On the IO board 440 backing the CPU board 410, the PCIe or equivalent high speed traces can be routed using the shortest path to either the chip down endpoint devices or else the PCIe or OCP sockets for expansion cards since there are no CPUs nor memory sockets and their connections, nor are there any major power supplies like the CPU VRMs that would interfere with the signal integrity of the high speed traces. There may be some small minor power supplies like those required for IOCs, but no major power supplies.

Another embodiment of the present disclosure is a method of simplifying and shortening the trace routing of high speed IO buses while routing out the largest possible number of integrated IO ports. As shown in FIG. 4, the method uses disaggregation of a motherboard 400 with similar functionality as those shown in FIGS. 1-3 into a CPU and memory board hereafter referred to as a CPU board 410 and an IO board 440 containing all IO devices. The two boards may be connected via a high pin-count, high speed connector 420 at the backside of the CPU PCB 411 and its mating connector 430 at the backside of the second PCB 441. The connector 420 may be positioned at substantially mid-distance between the CPUs. Within the limitations of the routing constraints, this allows for the shortest routing of the high speed differential trace pairs to the connector 420. The connector 420 may be a high-speed, high density pin array with enough pins and shields to route all PCIe lanes including those used as interconnect to the chipset, e.g. desktop management interface (DMI) to the platform controller hub (PCH) located on the IO board. The CPU board assembly 410 may have a printed circuit board (PCB) 411 to integrate at least one CPU, its memory subsystem 415a and the CPU and memory power supply or voltage regulator modules (VRM) 416a. In most cases, the CPU board 410 will have two CPUs 412a, 412b with their near node memory subsystems 415a, 415b having a DIMM installed in a memory slot, and separate VRMs 416a, 416b. The VRMs 416a, 416b are generating the supply voltage for the CPUs 412a, 412b and DIMMs 415.

For ease of routing, in a dual CPU or dual socket board, the CPUs 412a, 412b may be rotated 180 degrees relative to each other so that the system IO pins of both CPUs 412a, 412b are facing each other. This allows for the shortest and least convoluted peer to peer routing of the CPU interconnect bus.

The mating counterpart 430 to the connector 420 may be mounted on the second PCB 441, which contains all interfaces to the outside world, the assembly of which is hereafter referred to as the IO board 440. The IO board 440 may contain the system logic or chip set (if required), as for example a South bridge or platform controller hub (PCH) 417. The IO board may further contain a baseboard management controller (BMC) or equivalent management or Super IO controller.

In addition, the IO board 440 may include all chip-down peripheral devices 450a, 450b, 450c (See FIG. 4) that may be connected to the PCIe integrated IO (IIO) root complex via PCIe lanes or any other suitable interconnect/protocol. Such chip-down devices may include SAS/SATA/RAID controllers, expanders, PCIe switches, Ethernet or Fibre channel controllers, audio and video controllers and any other peripheral interface controllers such as USB, Firewire or similar and their connectors 445. The IO card may further contain a PCIe expansion slot 470 in either the standard form factor or configured to conform with the OCP specification or any variation thereof.

The PCIe expansion slot may be wired through the mezzanine connector to one of the two CPUs 412a, 412b through data path 425. The PCIe expansion slot may be used in combination with the PCIe riser card 475. In addition, the IO board 440 may contain any proprietary connector 460 to connect to a backplane, midplane, baseboard or any other structure to connect to peripheral devices. Non limiting examples for such peripheral devices are hard disk drives (HDDs), solid state drives (SSDs), graphics processing units (GPUs), or co-processors.

FIG. 5 shows an isometric view of the method for using a disaggregated motherboard for reducing trace length, viewed from the CPU board 410 perspective, whereas the IO board 440 is at the backside of the CPU board. The CPU board 410 may include a printed circuit board 411, which contains the two CPUs 412a, 412b and the two VRMs 416a, 416b arranged on the outside of the two CPUs 412a, 412b. Each CPU may have a plurality of DIMM slots 414 populated with DIMMs 415.

Centrally located on the backside of CPU board is the mezzanine connector 420 that mates with its mating counterpart connector 430 mounted on the backside of the second PCB 441. The IO board 440 may contain several chip down logic components such as USB terminating in the USB ports 445a and integrated Ethernet accessible through RJ45 network connectors 445b. Additional IO functionality may be provided through PCIe add in cards 478a, 478b.

Figure 6:
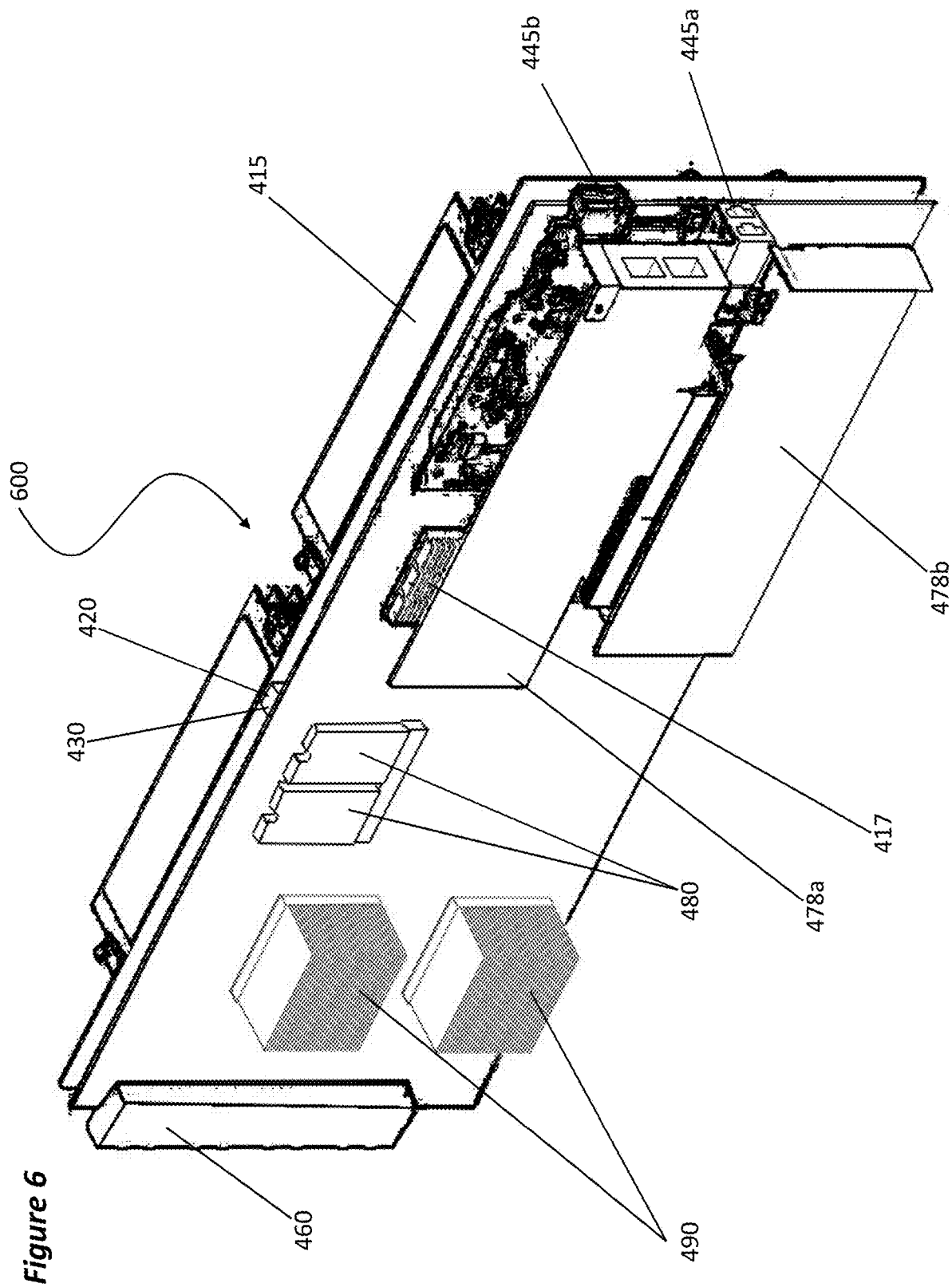
FIG. 6 illustrates another side view of the second exemplary modular motherboard of FIG. 4.

FIG. 6 illustrates an assembled motherboard aggregate 600 similar to that of FIG. 4, but from the IO board perspective. The IO board 440 may be connected, via the high speed connector 430, to its mating connector 420 and to the CPU board 410 which includes the two CPUs 412a, 412b, the VRMs 416a, 416b and the DIMMs 415 associated with the CPUs 412a, 412b. The BMC (not illustrated) and PCH 417 may also be integrated on the IO board 440. The IO board 440 may include several IO connectors, such as USB 445b and RJ45-based Ethernet ports 445a. Additionally, a high speed Ethernet PCIe expansion card 478a may be installed in one of the expansion slots of the PCIe riser card 475. A second PCIe expansion card 478b may be installed in the second expansion slot of the PCIe riser card 475. Two M.2 form factor boot/storage devices 480 may be installed at the top surface of the IO board 440 having two chip-down controller ICs 490. Connector 460 provides an interface to a backplane or midplane or else a base board.

Figure 7:
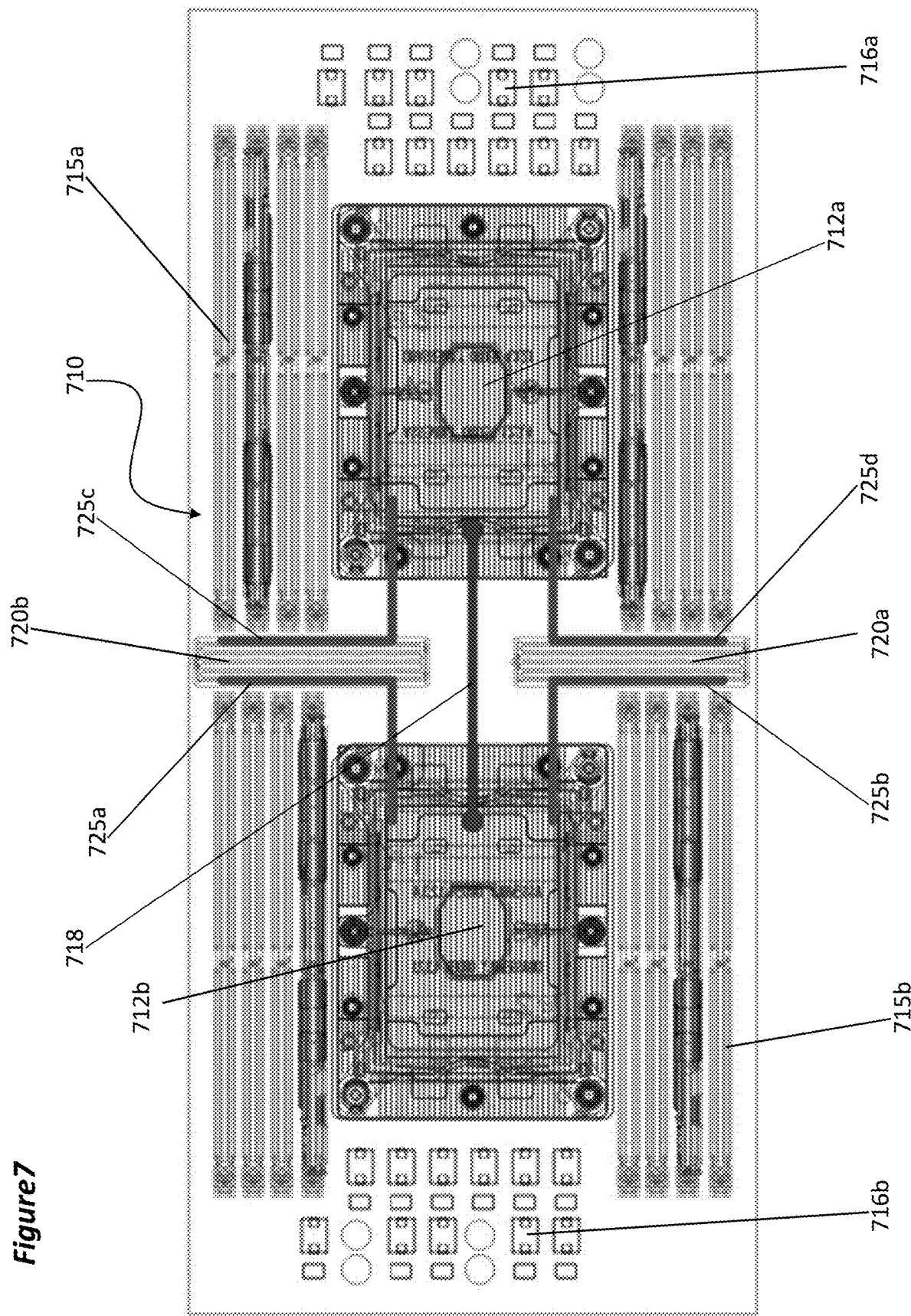
FIG. 7 illustrates a top plan view of a CPU board assembly to exemplify a routing topology of the high speed buses.

FIG. 7 illustrates a top plan view of a CPU board assembly 710 to exemplify a routing topology of the high speed buses. The CPU board assembly 710 may include two CPUs 712a, 712b, near respective node DIMMs 715a and 715b and the VRMs 716a, 716b for each CPU. A CPU Interconnect bus 718 may be routed directly peer to peer through traces in the printed circuit board. PCIe lanes 725a, 725b, 725c, 725d may be routed from the CPU socket to connectors 720a, 720b. Each connector 720a, 720b may be shared between PCIe lanes 725a, 725b, 725c, 725d from both CPUs.

On the IO board 440 backing the CPU board, the PCIe or equivalent high speed traces can be routed using the shortest path to either the chip down endpoint devices or else the PCIe or OCP sockets for expansion cards since there are no CPU nor memory sockets and their buses, nor are there any power supplies like the CPU VRMs that may interfere with the signal integrity of the high speed traces.

Figure 8:
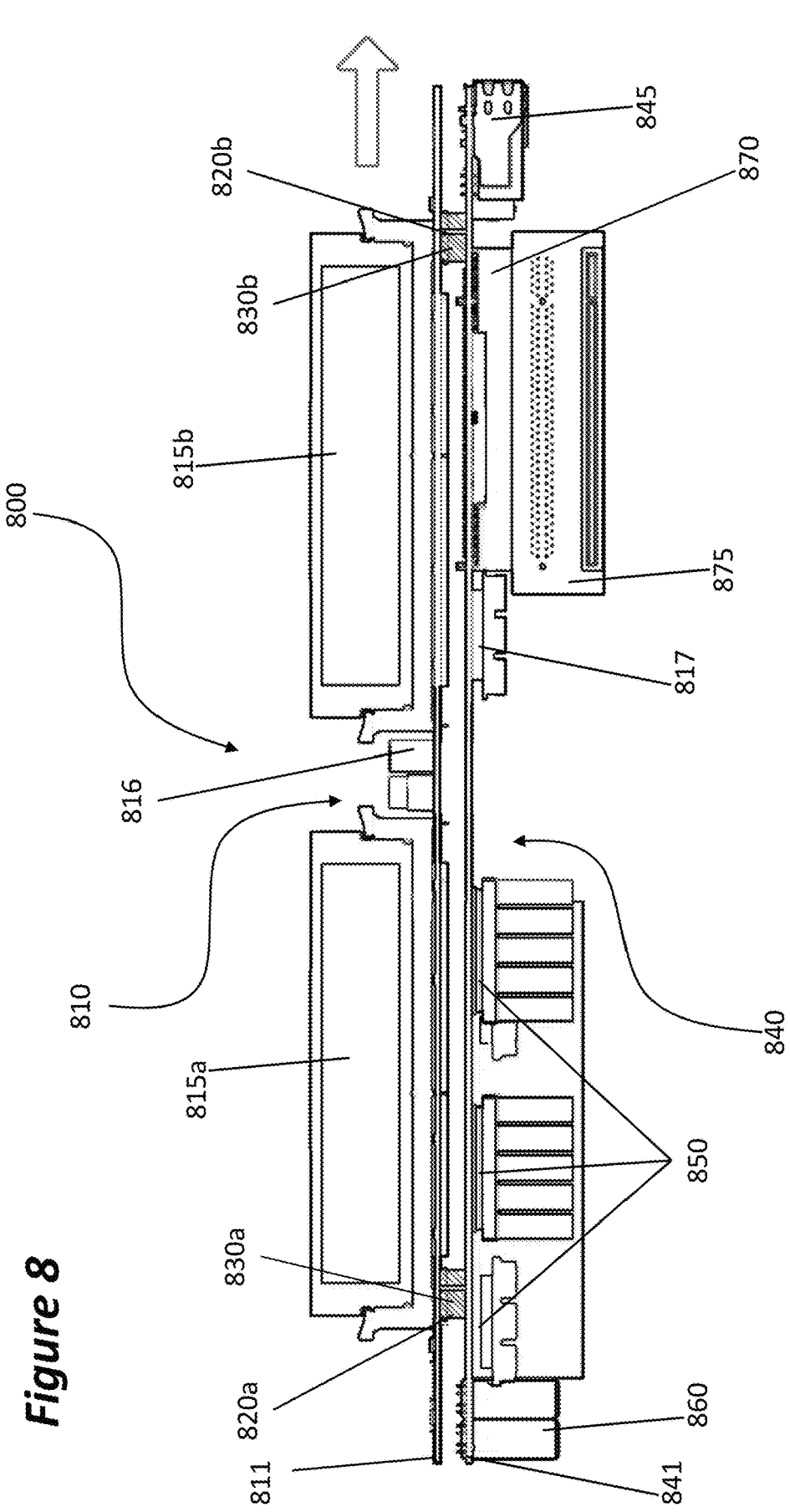
FIG. 8 illustrates an alternative method of reducing the trace length by using a modular motherboard.

FIG. 8 illustrates an alternative method of reducing the trace length by using a modular motherboard 800. The motherboard 800 may comprise a CPU board 810 having a printed circuit board 811, two central processing units with respective memory subsystems 815a, 815b. The central processing units may be rotated relative to each other so that their power pin sections are adjacent to each other and they are sharing a common voltage regulator module 816. As a result, the IO pin sections are facing away from each other and the traces escape to the connectors 820a and 820b. The connectors 820a and 820b mate with their counterpart connectors 830a and 830b on the bottom side of the printed circuit board 841 of the IO board 840 having a connector 860 to interface with a baseboard or backplane or any other suitable system component known in the art. In this configuration, all high speed signal lanes from CPU1 may be routed to chip down integrated circuits 850, whereas the high speed signals of CPU0 may be routed to an expansion slot 870 with an optional riser card 875. Additional high speed signals may be routed to the system logic or chipset 817 connected to the IO port 845.

Figure 9:
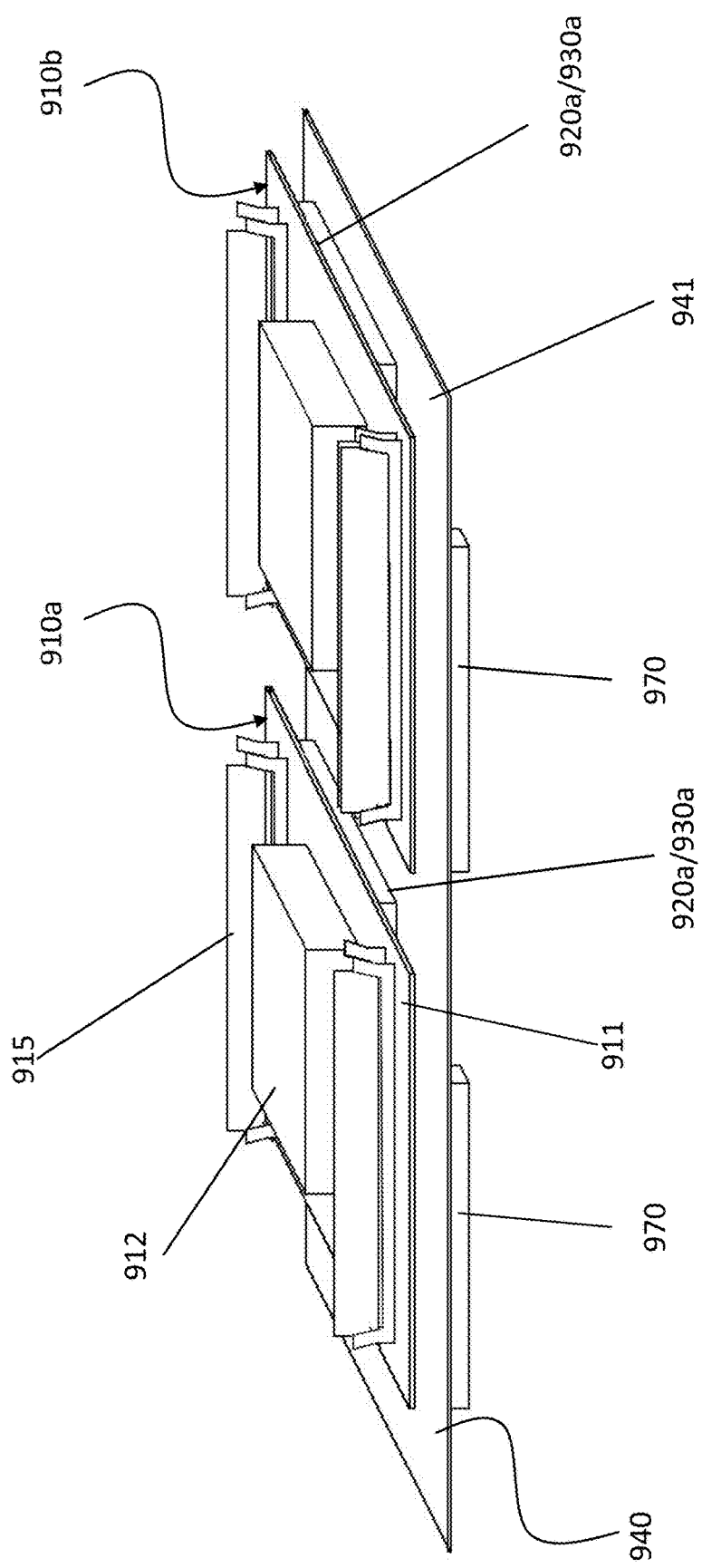
FIG. 9 illustrates two motherboards functionally integrated using a common IO board, according to another aspect of the present disclosure.

FIG. 9 illustrates two motherboards 910a and 910b functionally integrated using a common IO board 940, according to another aspect of the present disclosure. Each motherboard 910a and 910b may include a CPU 912 and memory 915 on a first surface and a high speed mezzanine IO connector 920a on the opposing surface of the printed circuit board 911. The high speed mezzanine IO connector 920a may be configured to engage with its mating counterpart 930a on a first surface of the printed circuit board 941 of the IO board 940 The IO board 940 may further include a high speed connector 970 which may be mounted on a second surface of the printed circuit board 911. The IO board 940 may also have a chipset logic for each motherboard as well as a baseboard management controller for each motherboard.

Figure 10:
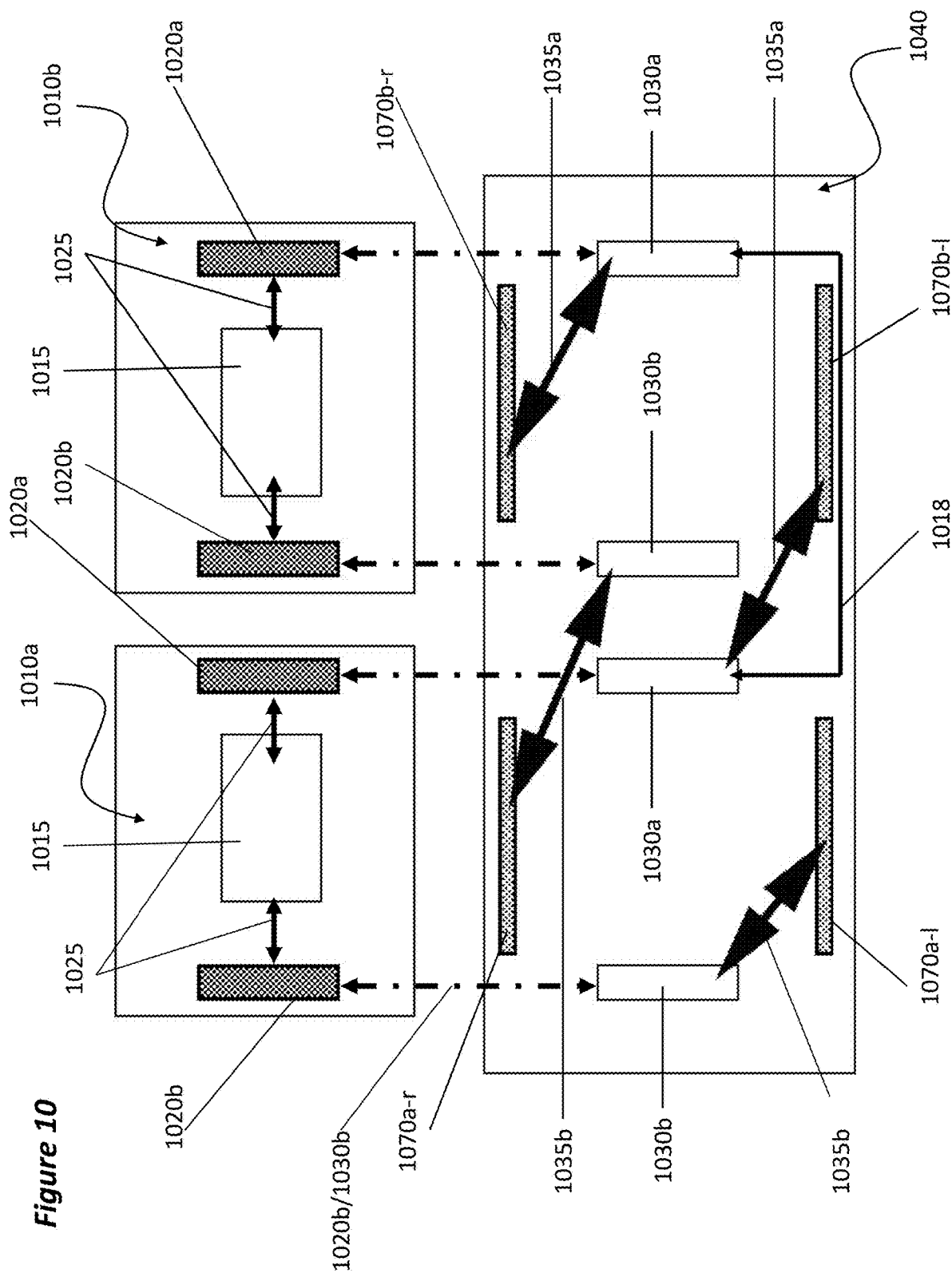
FIG. 10 illustrates the signal routing topology of a dual motherboard plus common IO board assembly.

FIG. 10 illustrates an exemplary signal routing topology of a dual motherboard plus common IO board assembly. For clarity and ease of understanding, the memory slots have been omitted from the illustration. A pair of motherboards 1010a and 1010b, each having a CPU 1015 mounted on the top surface of a printed circuit board as well as two high speed mezzanine IO connectors 1020a, 1020b, coupled through IO traces 1025 to the respective CPU 1015 and mounted on the bottom surface of the printed circuit board are shown. An IO board 1040 may include four high speed mezzanine IO receptacles 1030a, 1030b mounted on its top surface configured to functionally mate (e.g. 1020b/1030b) with the mezzanine IO connectors 1020a, 1020b of the motherboards 1010a and 1010b. The high speed IO traces 1035a, 1035b on the IO board 1040 may be routed from the mezzanine receptacles 1030a, 1030b mounted on the upper surface of the IO board 1040 to secondary IO connectors on the bottom surface of the IO board 1070a-l, 1070a-r, 1070b-l, 1070b-r, arranged into groups a and b and a left (-l) and right (-r) interface. This particular arrangement allows for configuring two motherboards to connect with two substantially identical system boards while maintaining the same signal topology between each motherboard and each target device on the system boards. A high speed signal path 1018 is shown between the two CPUs 1015, which may be a non-transparent bridge (NTB) routed through the mezzanine connectors and the IO board.

While the present disclosure has been described in form of specific and preferred embodiments and form factors, it is foreseeable that functionally equivalent designs could be used or subsequently developed to perform the intended functions of the tiled architecture. For example, different generations of CPU and interconnect standards beyond PCIe or Quick/Ultra Path Interconnect may be implemented. Therefore, it is apparent that other forms could be adopted by one skilled in the art. Finally, while the appended claims recite certain aspects believed to be associated with the invention and investigations discussed above, they do not necessarily serve as limitations to the scope of the invention.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Accordingly, the various features associate with the examples described herein and shown in the accompanying drawings can be implemented in different examples and implementations without departing from the scope of the disclosure. Therefore, although certain specific constructions and arrangements have been described and shown in the accompanying drawings, such implementations are merely illustrative and not restrictive of the scope of the disclosure, since various other additions and modifications to, and deletions from, the described implementations will be apparent to one of ordinary skill in the art. Thus, the scope of the disclosure is only determined by the literal language, and legal equivalents, of the claims which follow.

What is claimed is:

1. A modular computer motherboard, comprising:
   a first printed circuit board assembly, the first printed circuit board assembly comprising:
      a first printed circuit board having a first surface and an opposite second surface;
      a first central processing unit mounted on the first surface of the first printed circuit board, the first central processing unit having integrated input/output ports;
      a system memory socket mounted on the first surface of the first printed circuit board;
      a power supply for powering the central processing unit and the memory slot; and
      a first high speed data connector mounted on the second surface of the first printed circuit board and connected to the integrated input/output ports of the first central processing unit on the first surface of the printed circuit board; and
   a second printed circuit board assembly mounted to the second surface of the first printed circuit board, the second printed circuit board assembly comprising:
      a second printed circuit board having a first surface and an opposite second surface;
      an input/output interface, coupled to the first surface of the second printed circuit board, for providing input/output functionality; and
      a second high speed data connector mounted on the second surface of the second printed circuit board and adapted to couple with the first high speed data connector mounted on the second surface of the first printed circuit board and a high speed peripheral device interface; and wherein the input/output functionality of the combined first and second circuit boards is determined by the functionality of the second printed circuit board;

wherein the first high speed data connector interfaces to the second printed circuit board for providing input/output functionality; and wherein the second high speed data connector interfaces to the first printed circuit board for providing central processing functionality.

2. The motherboard of claim 1, wherein the second printed circuit board assembly further includes at least one of a system logic integrated circuit, a management controller and a high speed peripheral device interface mounted thereon.

3. The motherboard of claim 1, further comprising:
a boot device removably coupled to the second printed circuit board assembly.

4. The motherboard of claim 1, wherein the first printed circuit board assembly further comprises:
a second central processing unit mounted on the first surface of the first printed circuit board;
an interconnect bus, between the first central processing unit and the second central processing unit, routed point to point on the first printed circuit board; and
wherein signals from the integrated input/output ports from the first and second central processing units share the first high speed data connector.

5. The motherboard of claim 4, further comprising:
a third high speed connector mounted on the first printed circuit board assembly and configured to couple with a fourth high speed connector mounted on the second printed circuit board assembly.

6. The motherboard of claim 5, wherein the first high speed data connector is positioned adjacent to the first central processing unit and away from the second processing unit; and wherein the third high speed connector is positioned adjacent to the second central processing unit and away from the first central processing unit.

7. The motherboard of claim 6, wherein the first high speed data connector is coupled to only the first central processing unit, and the third high speed connector is coupled to only the second central processing unit.

8. The motherboard of claim 4, wherein the first high speed data connector is positioned between the first and second central processing units.

9. The motherboard of claim 4, wherein the first high speed data connector carries signals between the first and second central processing units and the second printed circuit board assembly.

10. A method for manufacturing a computer motherboard with reduced length interconnection traces, comprising:
dividing the motherboard into a first printed circuit board assembly and a second printed circuit board assembly;
forming a first printed circuit board assembly, the first printed circuit board comprising:
a first printed circuit board having a first surface and an opposite second surface;
a first central processing unit mounted on the first surface of the first printed circuit board, the first central processing unit having integrated input/output ports;
a system memory socket mounted on the first surface of the first printed circuit board;
a power supply to provide power to the central processing unit and the memory slot; and
a first high speed data connector mounted on the second surface of the first printed circuit board and connected to the integrated input/output ports of the first central processing unit on the first surface of the printed circuit board; and
forming a second printed circuit board assembly mounted to the second surface of the first printed circuit board, the second printed circuit board comprising:
a second printed circuit board with a first surface and an opposite second surface;
an input/output interface, coupled to the first surface of the second printed circuit board, for providing input/output functionality;
a high-speed peripheral device interface; and
a second high speed data connector mounted on the second surface of the second printed circuit board, and adapted to couple with the first high speed data connector mounted on the second surface of the first printed circuit board and a high speed peripheral device interface; and
wherein the input/output functionality of the combined first and second circuit boards is determined by the functionality of the second printed circuit board;
wherein the first high speed data connector interfaces to the second printed circuit board for providing input/output functionality; and
wherein the second high speed data connector interfaces to the first printed circuit board for providing central processing functionality.

11. The method of claim 10, wherein the second printed circuit board assembly includes at least one of a system logic integrated circuit and a management controller integrated thereon.

12. The method of claim 10, wherein a boot device is removably attached to the second printed circuit board assembly.

13. The method of claim 10, wherein the first printed circuit board assembly further comprises:
a second central processing unit mounted on the first surface of the first printed circuit board;
an interconnect bus, between the first central processing unit and the second central processing unit, routed point to point on the first printed circuit board; and
wherein signals from the integrated input/output ports from the first and second central processing units share the same first high speed data connector.

14. The method of claim 10, wherein the first printed circuit board assembly further comprises:
a second central processing unit integrated on the first printed circuit board assembly; and,
wherein an interconnect bus, between the first and the second central processing unit, routed point to point on the printed circuit board;
wherein signals from the integrated input/output ports of the first central processing unit are routed to the first connector; and
wherein signals from the integrated input/output ports of the second central processing unit are routed to a third connector configured to mate with a fourth connector on the second printed circuit board assembly.

15. A computer motherboard, comprising:
a first printed circuit board assembly, the first printed circuit board assembly comprising:
a first printed circuit board having a first surface and an opposite second surface;

one or more central processing units mounted on the first surface of the first printed circuit board;

a system memory socket mounted on the first surface of the first printed circuit board;

a first high speed data connector mounted on the second surface of the first printed circuit board and connected to the one or more central processing units on the first surface of the printed circuit board; and a second printed circuit board assembly mounted to the second surface of the first printed circuit board, the second printed circuit board assembly comprising:

a second printed circuit board having a first surface and an opposite second surface;

an input/output interface, coupled to the first surface of the second printed circuit board, for providing input/output functionality;

a high-speed peripheral device interface; and a second high speed data connector mounted on the second surface of the second printed circuit board and adapted to couple with the first high speed data connector mounted on the second surface of the first printed circuit board and the high speed peripheral device interface; and wherein the input/output functionality of the combined first and second circuit boards is determined by the functionality of the second printed circuit board;

wherein the first high speed data connector interfaces to the second printed circuit board for providing input/output functionality; and wherein the second high speed data connector interfaces to the first printed circuit board for providing central processing functionality.

16. The computer motherboard of claim 15, wherein routing of a signal path from the one or more central processing units to the input/output interface and/or the high-speed peripheral device interface is reduced.

17. A computer motherboard assembly, comprising:

a first printed circuit board assembly, the first printed circuit board assembly comprising:

a first printed circuit board having a first surface and an opposite second surface;

one or more central processing units mounted on the first surface of the first printed circuit board;

a system memory socket mounted on the first surface of the first printed circuit board;

a first high speed data connector mounted on the second surface of the first printed circuit board and connected to the one or more central processing units on the first surface of the printed circuit board; and a second printed circuit board assembly mounted to the second surface of the first printed circuit board, the second printed circuit board assembly comprising:

a second printed circuit board having a first surface and an opposite second surface;

one or more central processing units mounted on the first surface of the second printed circuit board;

a system memory socket mounted on the first surface of the second printed circuit board;

a second high speed data connector mounted on the second surface of the second printed circuit board and connected to the one or more central processing units on the first surface of the second printed circuit board; and a third printed circuit board assembly, the third printed circuit board assembly comprising:

a third printed circuit board having a first surface and an opposite second surface;

an input/output interface, coupled to the first surface of the third printed circuit board, for providing input/output functionality;

a high speed peripheral device interface; and a third high speed data connector mounted on the second surface of the third printed circuit board, the third high speed data connector adapted to couple with the first high speed data connector and the high speed peripheral device interface; and a fourth high speed data connector mounted on the second surface of the third printed circuit board, the fourth high speed data connector adapted to couple with the second high speed data connector and the high speed peripheral device interface; and wherein the input/output functionality of the combined first, and second circuit boards is determined by the functionality of the second printed circuit board;

wherein the first high speed data connector interfaces to the second printed circuit board for providing input/output functionality; and wherein the second high speed data connector interfaces to the first printed circuit board for providing central processing functionality.

18. The computer motherboard assembly of claim 17, wherein the high speed peripheral device interface comprises at least two connectors.

19. The computer motherboard assembly of claim 17, wherein the third printed circuit board assembly is adapted to connect to a first boot device for the first circuit board assembly and a second boot device for the second circuit board assembly.

20. The computer motherboard assembly of claim 17, wherein the third printed circuit board assembly is adapted to couple the one or more central processing units of the first circuit board assembly and the second circuit board assembly.

21. The computer motherboard assembly of claim 17, wherein the third printed circuit board is configured to route a first group of high speed signals from the first printed circuit board and the second printed circuit board to a left high speed peripheral device interface and a second group of high speed signals from the first printed circuit board and the second printed circuit board to a right high speed peripheral device interface.

* * * * *